(12) United States Patent
Kazakevich et al.

(10) Patent No.: US 7,010,282 B2
(45) Date of Patent: *Mar. 7, 2006

(54) DYNAMIC BIAS FOR RF POWER AMPLIFIERS

(75) Inventors: Leonid Kazakevich, Plainview, NY (US); Patrick Cabrol, Bay Shore, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 244 days.

This patent is subject to a terminal disclaimer.

(21) Appl. No.: 10/722,941

(22) Filed: Nov. 26, 2003

(65) Prior Publication Data

US 2004/0106385 A1    Jun. 3, 2004

Related U.S. Application Data

(63) Continuation of application No. 09/773,857, filed on Feb. 1, 2001, now Pat. No. 6,684,064.

(60) Provisional application No. 60/192,528, filed on Mar. 28, 2000.

(51) Int. Cl.
*H04B 1/04* (2006.01)
(52) U.S. Cl. ............... 455/127.1; 455/126; 455/69; 455/127.2
(58) Field of Classification Search ........ 455/522, 455/127.2, 126, 127.1, 69, 115.1; 330/136
See application file for complete search history.

(56) References Cited

U.S. PATENT DOCUMENTS

| | | | |
|---|---|---|---|
| 5,101,173 A | 3/1992 | DiPiazza et al. | |
| 5,119,042 A | 6/1992 | Crampton et al. | |
| 5,239,695 A | 8/1993 | Jung | |
| 5,625,322 A | 4/1997 | Gourgue et al. | |
| 5,655,220 A * | 8/1997 | Weiland et al. | 455/69 |
| 5,999,057 A | 12/1999 | Carlsson et al. | |
| 6,047,168 A | 4/2000 | Carlsson et al. | |
| 6,236,841 B1 | 5/2001 | Akiya | |
| 6,301,486 B1 | 10/2001 | Tanaka | |
| 6,321,072 B1 | 11/2001 | Cipriani et al. | |
| 6,330,455 B1 | 12/2001 | Ichihara | |
| 6,385,183 B1 | 5/2002 | Takeo | |
| 6,466,772 B1 | 10/2002 | Rozenblit et al. | |
| 6,735,424 B1 * | 5/2004 | Larson et al. | 455/250.1 |
| 2004/0012443 A1 * | 1/2004 | Ikonen et al. | 330/136 |

* cited by examiner

*Primary Examiner*—Lana Le
(74) *Attorney, Agent, or Firm*—Volpe and Koenig, P.C.

(57) ABSTRACT

A subscriber unit and method for wireless communication that dynamically adjusts RF amplifier operating bias for the subscriber unit's transmitter in response to a power control signal. The invention provides high-efficiency RF power amplification for applications where the available power source is limited. The invention uses a power control signal resident in wireless communication system architectures with a detector and voltage to current converter to arrive at a dynamic amplifier operating bias.

10 Claims, 5 Drawing Sheets

DYNAMIC BIAS FOR RF POWER AMPLIFIERS

CROSS REFERENCE TO RELATED APPLICATION(S)

This application is a continuation of U.S. patent application Ser. No. 09/773,857, filed on Feb. 1, 2001, now Pat. No. 6,684,064 and claims priority from Provisional Patent Application Ser. No. 60/192,528, filed on Mar. 28, 2000.

FIELD OF INVENTION

The present invention relates generally to wireless digital communication systems. More specifically, the invention relates to a system and method for dynamically biasing a radio frequency (RF) power amplifier used for transmitting wireless communications.

BACKGROUND

A digital communication system typically transmits information or data using a continuous frequency carrier with modulation techniques that vary its amplitude, frequency or phase. After modulation, the signal is amplified and transmitted over a communication medium.

A multiple-access communication system allows a plurality of subscriber units to access the same communication medium to transmit or receive information. The communication medium is commonly referred to as the communication channel, conveying information from one location to another. For RF communications, the channel is the electromagnetic frequency spectrum which extends from very low frequencies of several kHz, through the short waves of several MHz, to very high frequencies and ultrahigh frequencies extending up to several hundred MHz and into the microwave region beginning approximately at 1 GHz.

A prior art multiple access communication system is shown in FIG. 1. Communication techniques such as frequency division multiple access (FDMA), time division multiple access (TDMA), carrier sense multiple access (CSMA), code division multiple access (CDMA) and others allow access to the same communication medium for more than one subscriber unit. These techniques can be mixed together creating hybrid varieties of multiple access schemes. For example, time division duplex (TDD) mode of the proposed 3rd generation wireless protocols is a combination of TDMA and CDMA.

An example prior art CDMA wireless communication system is shown in FIG. 2. The communication data is transmitted with a broadened band (spread spectrum) by modulating the data to be transmitted with a pseudo-noise (PN) signal. The data signal to be transmitted may have a bandwidth of only a few thousand Hertz distributed over a frequency band that may be several million Hertz. The communication channel is used simultaneously by a plurality of independent subchannels. For each subchannel, all other subchannels appear as interference.

As shown, a single subchannel of a given bandwidth is mixed with a unique spreading code which repeats a predetermined pattern generated by a wide bandwidth PN sequence generator. These unique spreading codes are typically pseudo-orthogonal to one another such that the cross-correlation between the spreading codes is close to zero. A data signal is modulated with the PN sequence to produce a digital spread spectrum signal. A carrier signal is then modulated with the digital spread spectrum signal and transmitted. A receiver demodulates the transmission to extract the digital spread spectrum signal. The transmitted data is reproduced after correlation with the matching PN sequence. When the spreading codes are orthogonal to one another, the received signal can be correlated with a particular subscriber unit signal related to the particular spreading code such that only the desired subscriber unit signal related to the particular spreading code is enhanced, while the other signals for all other subscriber units are not enhanced.

Since many subchannels in a CDMA system share the same bandwidth, most prior art wireless communication systems use some form of adaptive transmit power control (TPC) to prevent one subchannel from jamming another. When a subscriber unit or a base station is receiving a specific signal, all other subchannels or subscriber units' signals appear as noise. Therefore, increasing the power level of one subscriber unit's signal increases the noise presented to all other subscriber units.

In prior art CDMA communication systems, a base station transmits a communication signal on a downlink to a particular subscriber unit. Upon reception, a qualitative signal measurement is taken and compared. Based on the comparison, a TPC signal is sent in an uplink to the base station, ordering the base station to either increase or decrease its transmit power to that particular subscriber unit. This methodology is known as forward channel power control. Conversely, power control for the transmissions sent from a subscriber unit to the base station is known as reverse channel power control.

The power level of a signal output for transmission is affected by adjusting the signal amplitude input to an RF amplifier with the TPC signal using a pre-driver stage, a variable gain amplifier, an attenuator or the like. However, the gain and bias of the amplifier remain fixed. Therefore, while the transmitted signal amplitude is increased or decreased, the operating point of the amplifier is constant.

The proposed $3^{rd}$ generation wireless protocols provide wide bandwidth, high data rate communication. The proposed bandwidths are a 5 to 10 MHz communication channel. However, it is known that approximately 10 to 15 dB of fast fading occurs. For example, if a mobile subscriber unit is located at the border of a defined cell and is transmitting at maximum power, a 10 to 15 dB transmit output power margin is required for momentary increments of time. Such a condition is graphically represented in FIG. 3 by a plot of subscriber unit output power in dB versus time in seconds. The average transmit output power ranges between 12 and 17 dB. The occurrence of transient peaks above average transmit power amounts to approximately one (1) to ten (10) % across the sixteen (16) second time distribution sample shown in FIG. 3. This demonstrates the limited duration for which high transmit power is required.

The most common method for modulating data signals is quadrature amplitude modulation (QAM) which varies a predefined carrier frequency amplitude and phase according to an input signal. The reason for the popularity is the many types of QAM (64 QAM, 256 QAM, etc.) and quadrature phase shift keying (QPSK) use the available bandwidth more efficiently by including amplitude information as part of the modulation unlike frequency modulation (FM), frequency shift keying (FSK), phase shift keying (PSK), or binary phase shift keying (BPSK) that contain little or no amplitude information. In order to amplify the signal properly, the transmitter power amplifier must operate in a linear mode. The dynamic range of input signals at the modulator port can be very large. For example, in 3rd generation wireless protocols, the input signal peak to average ratio may be greater than 10 dB.

Large transient peaks are undesirable. For every 3 dB increase in transmit output power, twice the base RF amplification power in Watts is required, which may force the amplifier into a nonlinear operating region of its response curve. This results in increased out-of-band emissions and reduced amplifier efficiency. In addition, the amplifier's power source must have a capacity greater than the maximum transient that may be expected. This is particularly undesirable in hand-held battery operated devices. To design for higher power levels resulting from high transients, more complex amplifier circuitry is required. Otherwise, compromises between amplifier gain, battery life and communication time will result.

The prior art discloses many techniques to increase the efficiency of RF power amplifiers such as pre-distortion generators, envelope feedback correction and feed forward error correction. However, the remedies used in the prior art to increase RF power amplifier efficiency exacerbate existing design problems.

Accordingly, there exists a need for an RF amplifier that addresses the problems associated with the prior art.

SUMMARY OF THE INVENTION

The present invention is a subscriber unit and method that dynamically adjusts the operating bias of an RF amplifier of the subscriber unit's transmitter in response to a transmit power control (TPC) signal. The invention provides high-efficiency RF power amplification for applications where the available power source is limited. The invention uses a TPC signal resident in certain communication architectures with a detector and voltage-to-current converter to arrive at an amplifier operating bias in direct correspondence with transmitting power demand.

Accordingly, it is an object of the present invention to dynamically adjust the operating bias of an RF amplifier in dependence upon signal amplification demand.

Other objects and advantages of the system and method will become apparent to those skilled in the art after reading the detailed description of the preferred embodiment.

DETAILED DESCRIPTION OF THE INVENTION

Figure 1:
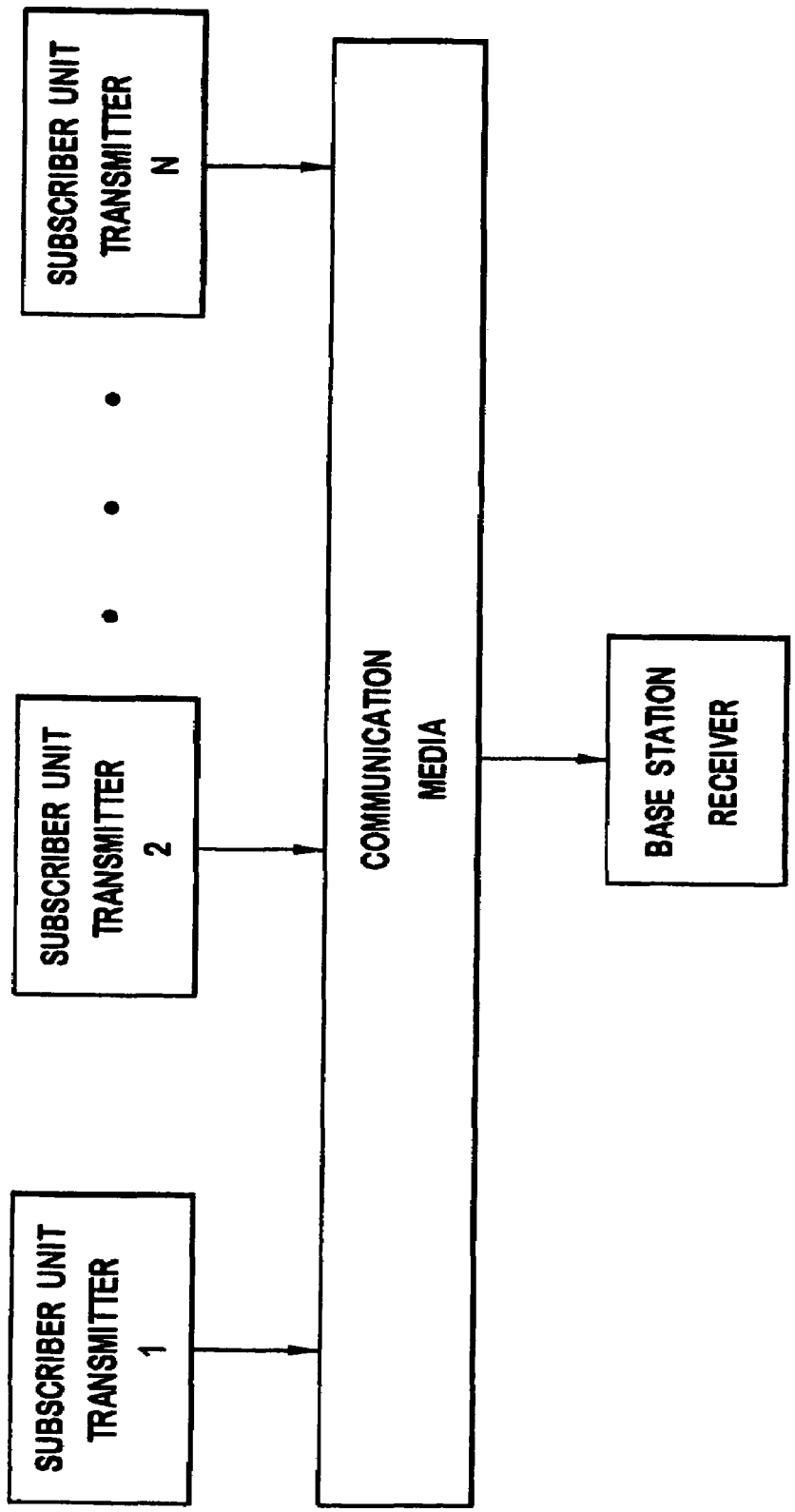
FIG. 1 is a simplified system diagram of a prior art multiple access communication system.
Figure 2:
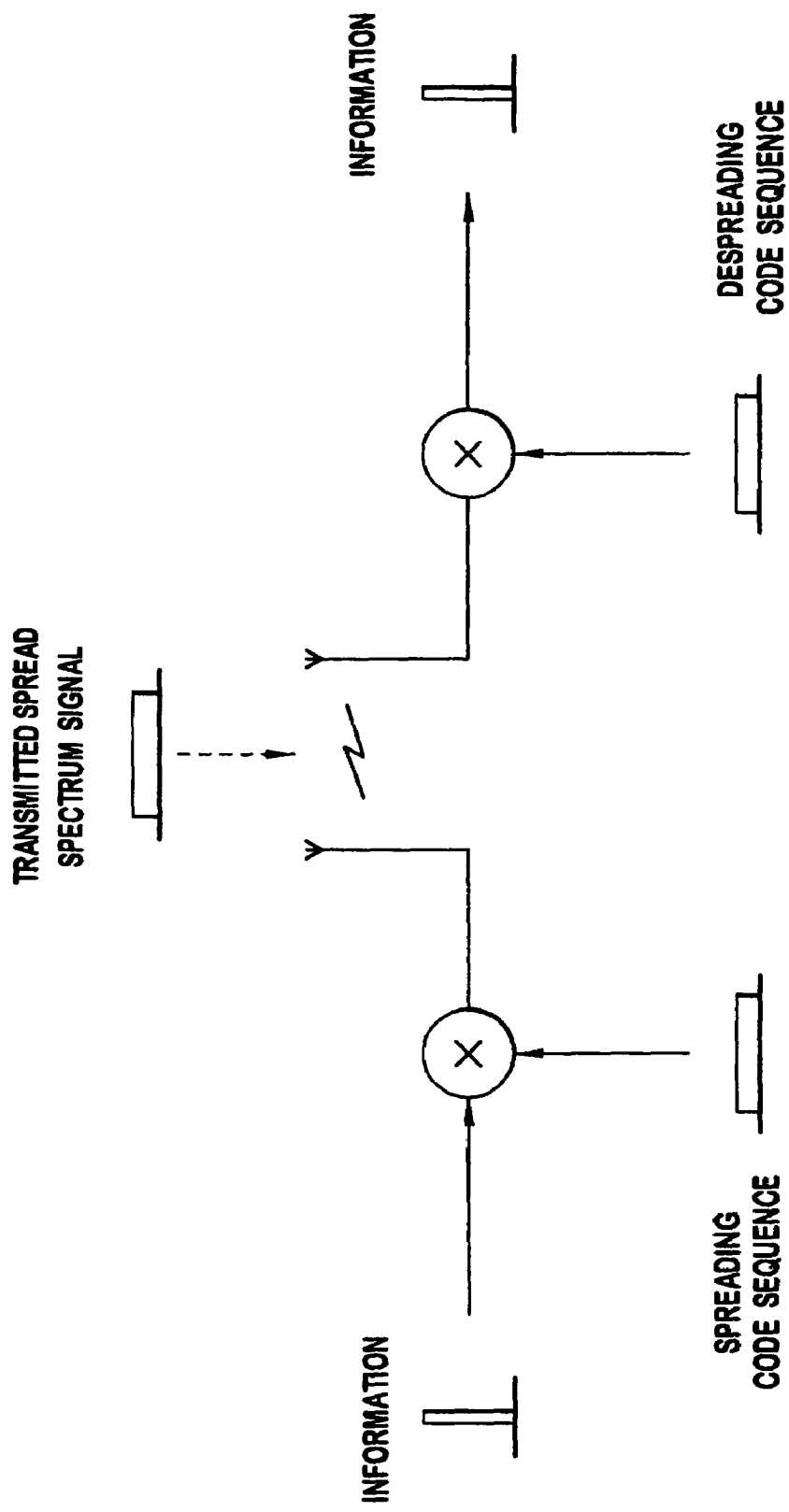
FIG. 2 is a simplified system diagram of a prior art wireless communication system.
Figure 3:
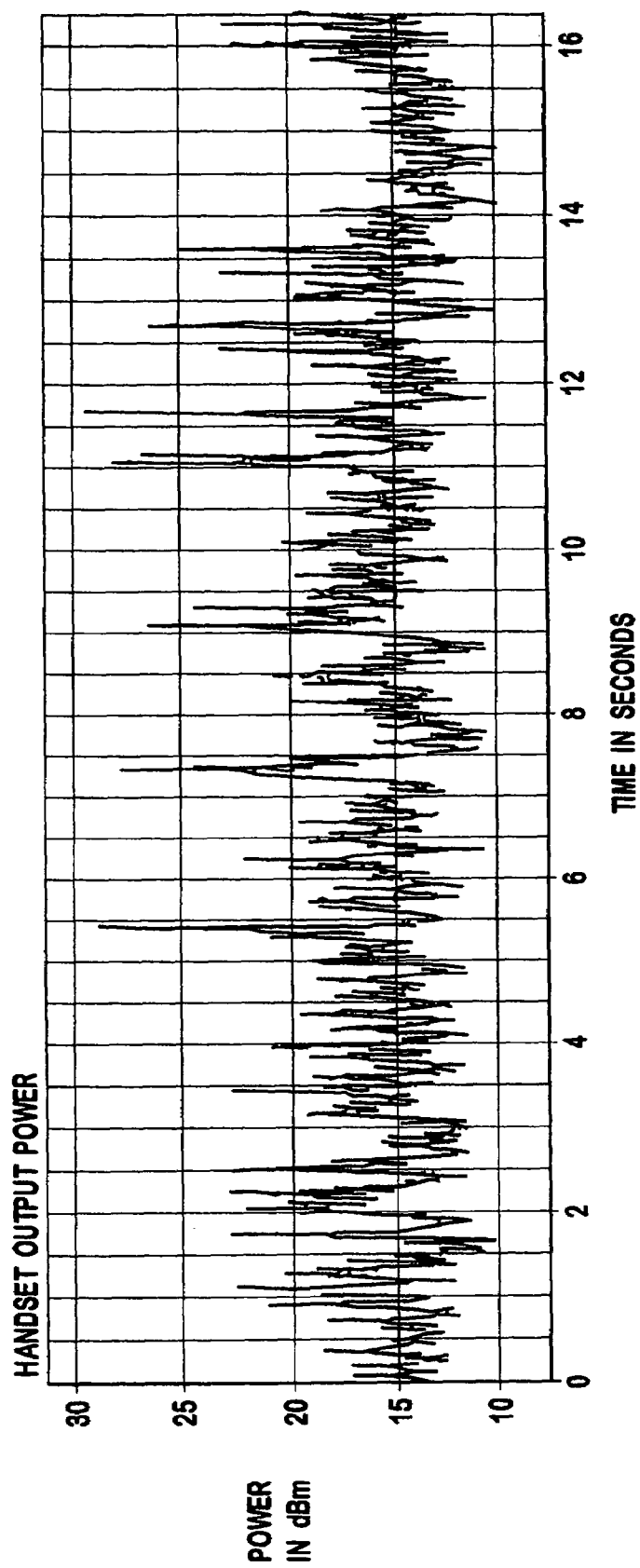
FIG. 3 is a plot showing short term peak power demands.

The embodiments will be described with reference to the drawing figures where like numerals represent like elements throughout.

Figure 4:
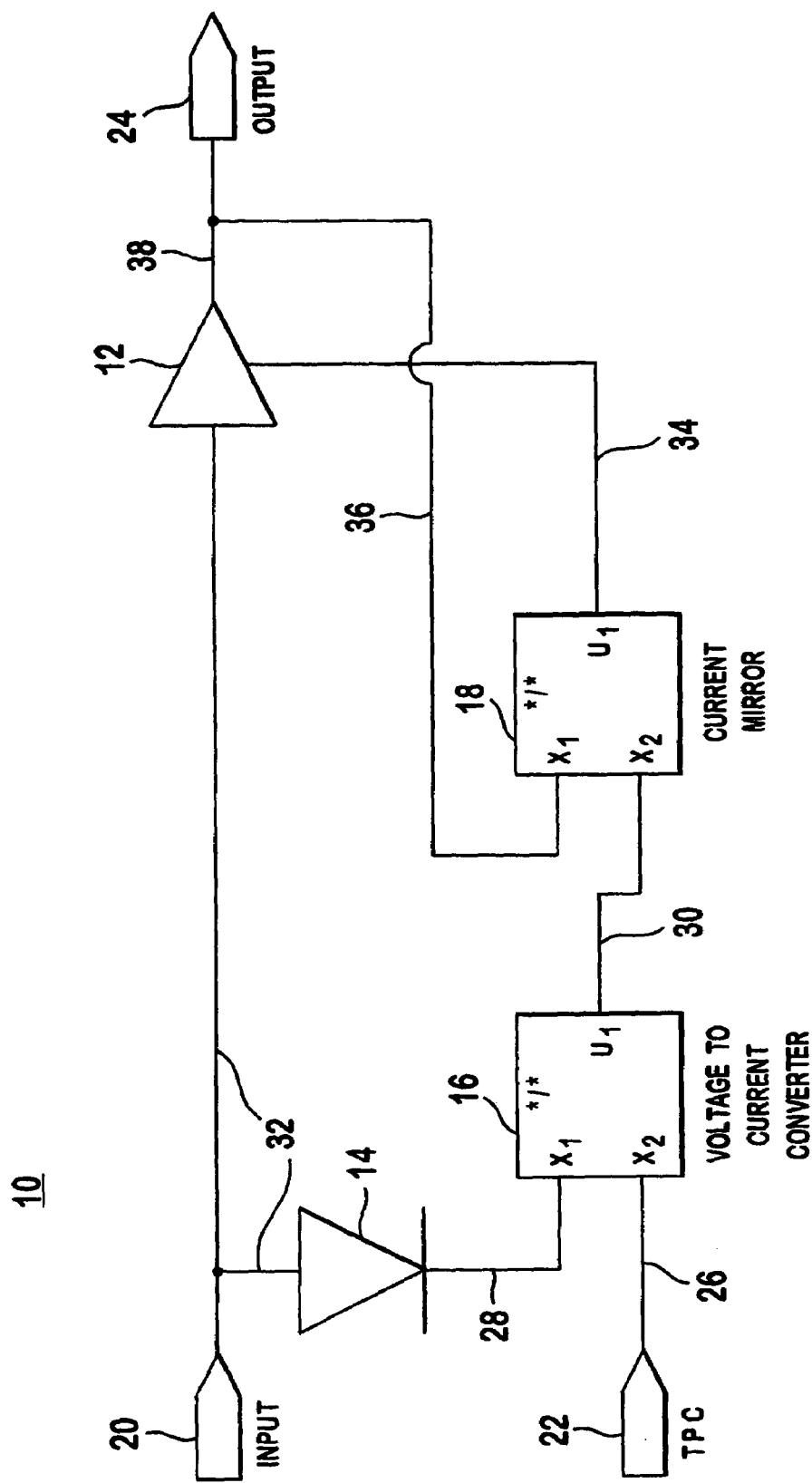
FIG. 4 is a system diagram of the present invention.

Shown in FIG. 4 is the dynamic bias amplification system 10 of the present invention incorporated within a subscriber unit. However, those of skill in the art should realize that this may also be incorporated as part of a base station. The system 10 comprises a communication signal input 20, an amplifier 12, a detector 14, a power control signal input 22, a voltage to current converter 16, a current mirror 18 and an output 24. For convenience in describing the present invention, reference is made to a wireless communication system using a TPC signal. However, those of skill in the art would recognize that the present invention may be utilized with any type of communication system utilizing a power control signal.

The communication signal input 20 provides an input wireless communication signal 32 ready for transmission. This input wireless communication signal 32 can comprise voice, data or any other type of wireless signal that may be transmitted by a wireless communication system.

RF amplifier 12 receives the input signal 32 and linearly increases the power of the input signal 32 to provide an output signal 38 at a greater power level. The RF amplifier 12 may comprise one or a plurality of gain stages, one or a plurality of bias adjustment means for each stage, input scaling, etc. The circuit topology of the RF amplifier 12 is beyond the scope of this disclosure.

The detector 14 removes the modulation component from the spread communication signal and provides a dc voltage output signal 28 that varies slowly with time. The detector 14 output is coupled to the first input of a voltage-to-current converter 16.

The control input 22 provides a TPC signal 26. The details regarding generation of the TPC signal 26 and/or TPC process is beyond the scope of this disclosure. Generally, however, the TPC signal 26 is derived from the base station, (or subscriber unit), performing a quantitative measurement on the transmission power of the subscriber unit, (or base station), respectively (i.e., a corresponding communicating entity). The base station or subscriber unit will transmit the TPC signal 26 to the corresponding communicating entity to direct the corresponding communicating entity to increase or decrease its power in accordance with the calculations performed by the base station or subscriber unit.

The voltage-to-current converter 16 accepts two inputs, scales the inputs and combines them to generate current output signal 30. The first input is the detector output signal 28. The second input is the TPC signal 26. The voltage-to-current converter 16 receives these inputs 26, 28 and scales, or weights, the inputs 26, 28 and combines the inputs 26, 28 in accordance with the following predetermined formula to form a current output signal 30:

$$VC \text{ Output Signal} = (W_1 * \log P) + (W_2 * \log V) \qquad \text{Equation (1)}$$

where: P=detector output 28 signal

V=TPC signal 26

$W_1$ and $W_2$ are design specific constants which are a function of the dynamic power control range, the waveform peak-to-average ratio and the architecture of the power amplifier used.

The current output signal 30 is coupled to one input of a current mirror 18. A feedback line 36 from the output 38 of the RF amplifier 12 is coupled to a second input of the current mirror 18. The current mirror 18 makes a comparison between the two input signals 30, 36 and outputs a bias current signal 34. As shown, the output bias current signal 34 is related both to the TPC signal 26 and the output 38 of the amplifier 12. For example, when the TPC signal 26 is high, it indicates that the base station is requesting greater transmitting power from the subscriber unit. As discussed in the prior art, the TPC signal 26 causes an appropriate increase or decrease in the power of the signals transmitted by the subscriber unit. Both the input signals 30, 36 are scaled for comparison. If the current output signal 30 is higher than the output 38 of the RF amplifier 12, the current mirror 18 increases the bias current signal 34. Likewise, if the current output signal 30 is lower than the output 38 of the RF amplifier 12, the current mirror 18 decreases the bias current signal 34.

Through the comparison process, the current mirror 18 produces greater or lesser bias current, thereby affecting the linear operating region of the RF amplifier 12. This provides additional headroom while maintaining the RF amplifier 12 in the linear operating region. When the TPC signal 26 decreases, the amplifier 12 does not require a large bias current, since high bias equates with higher power consumption. Therefore, the bias current is reduced to decrease power consumption.

Figure 5:
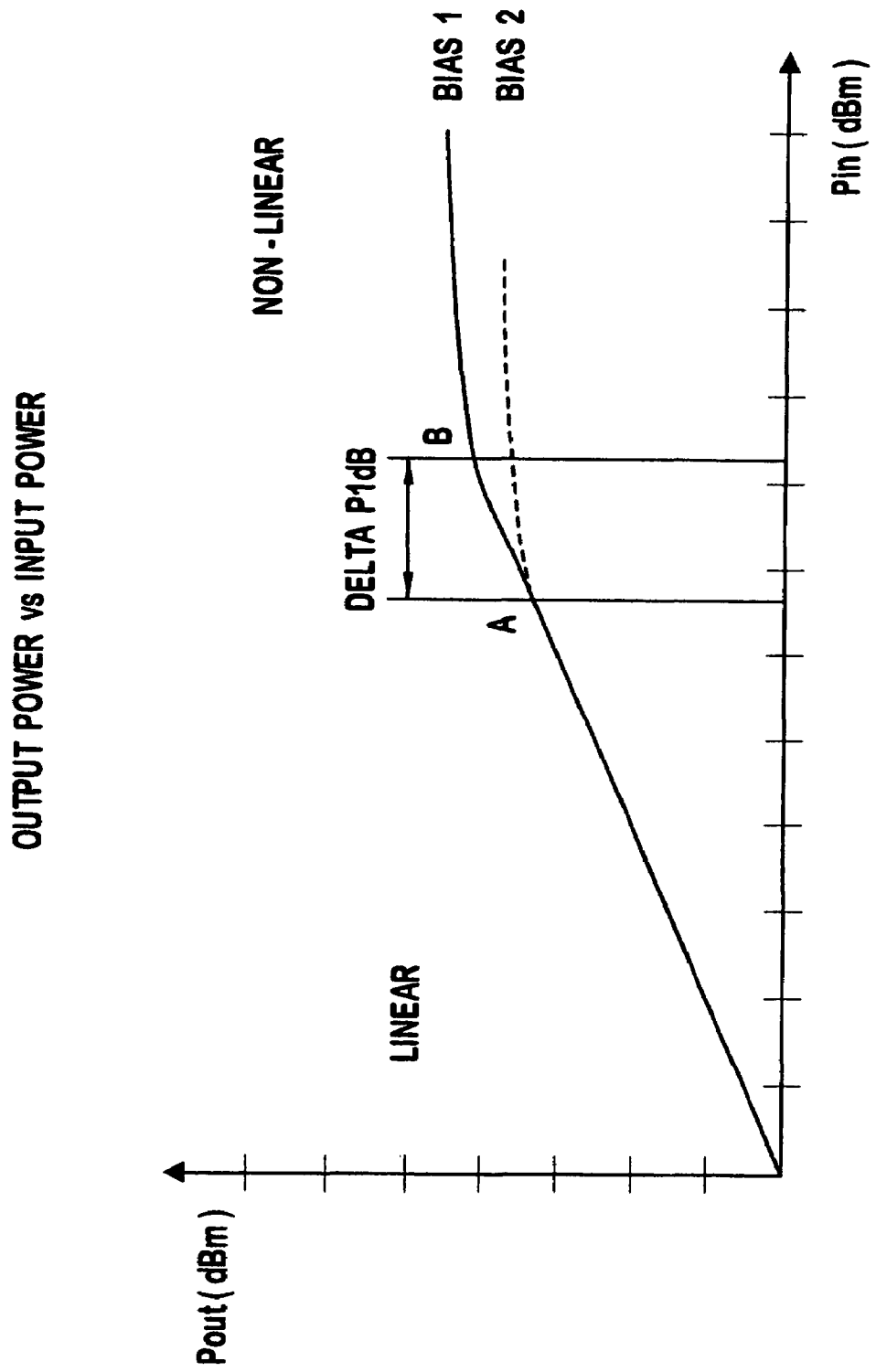
FIG. 5 is a plot of input power versus output power of the present invention.

Shown in FIG. 5 is a plot of amplifier gain, equivalent to the ratio of the amplifier output power $P_{out}$ to the amplifier input power $P_{in}$. The 1 dB compression point (P1dB) is the point at which amplifier gain becomes nonlinear. The 1 dB compression point for bias 2, shown as point A, occurs at an output power less than the 1 dB compression point for bias 1, shown as point B. As shown, the dynamic biasing values derived by the present invention extend the linear region of operation of the amplifier. Thus, as output power decreases, the bias current decreases accordingly, while still providing linear amplification. As input power increases, a bias current level is increased to maintain linear operation.

The present invention statistically outperforms prior art compensation techniques. Since the maximum power called on by the transmitter is only a small percentage of total transmit time, by dynamically tracking the TPC signal, the dynamically biased RF power amplifier of the present invention greatly improves power consumption.

While the present invention has been described in terms of the preferred embodiments, other variations which are within the scope of the invention as outlined in the claims below will be apparent to those skilled in the art.

What is claimed is:

1. A subscriber unit that receives data and a transmit power control (TPC) signal over a wireless communication downlink signal, comprising:
   an RF power amplifier (12) with a bias point for amplifying the communication signal to produce an RF output signal;
   a detector (14), for receiving said communication signal and removing modulation components from said communication signal to provide a detector output signal;
   a converter (16), coupled to said detector, configured to process said TPC signal and said detector output signal to generate a current signal; and
   a current mirror (18) for receiving said current signal and a feedback from said RF output signal and for comparing said current signal with said feedback to produce a bias signal; whereby said bias point of the RF amplifier is dynamically adjusted responsive to said bias signal.

2. The subscriber unit of claim 1, whereby said converter performs said processing by weighting both said TPC signal and said detector output signal and then combining said TPC and detector output signals.

3. The subscriber unit of claim 2, whereby said current mirror further scales said current signal and said feedback signal prior to said comparison.

4. The subscriber unit of claim 1, whereby said current mirror further scales said current signal and said feedback signal prior to said comparison.

5. The subscriber unit of claim 1, whereby said communication signal is a CDMA signal.

6. In a subscriber unit that receives data over a wireless communication downlink signal and a transmit power control (TPC) signal, a method for dynamically adjusting the operating bias of an RF power amplifier that amplifies a communication signal for transmission by the subscriber unit, the method comprising:
   receiving said communication signal and said TPC signal;
   removing modulation components from said communication signal to produce a dc voltage signal;
   processing said TPC signal and said dc voltage signal to generate a current signal;
   comparing said current signal with a feedback from the output of said RF power amplifier to produce a bias signal; and
   dynamically adjusting the operating bias of said RF amplifier using said bias signal.

7. The method of claim 6, whereby said processing step includes weighting said TPC signal and said dc voltage signal and then combining said weighted TPC and detector output signals.

8. The method of claim 7, whereby said comparing step further includes scaling said current signal and said feedback signal prior to said comparison.

9. The method of claim 6, whereby said comparing step further includes scaling said current signal and said feedback signal prior to said comparison.

10. The method of claim 6, whereby said communication signal is a CDMA signal.

* * * * *

UNITED STATES PATENT AND TRADEMARK OFFICE
CERTIFICATE OF CORRECTION

PATENT NO. : 7,010,282 B2  Page 1 of 1
APPLICATION NO. : 10/722941
DATED : March 7, 2006
INVENTOR(S) : Kazakevich et al.

It is certified that error appears in the above-identified patent and that said Letters Patent is hereby corrected as shown below:

At column 1, line 34, after the word "several", delete "kHz" and insert therefor --KHz--.

At claim 3, column 6, line 11, after the word "claim", delete "2" and insert therefor --1--.

At claim 4, column 6, line 14, after the word "claim", delete "1" and insert therefor --2--.

At claim 8, column 6, line 40, after the word "claim", delete "7" and insert therefor --6--.

At claim 9, column 6, line 43, after the word "claim", delete "6" and insert therefor --7--.

Signed and Sealed this

Fourteenth Day of November, 2006

JON W. DUDAS
*Director of the United States Patent and Trademark Office*